(12) United States Patent
Nakamura

(10) Patent No.: US 7,772,931 B2
(45) Date of Patent: Aug. 10, 2010

(54) OSCILLATOR AND A TUNING METHOD OF A LOOP BANDWIDTH OF A PHASE-LOCKED-LOOP

(75) Inventor: Masayuki Nakamura, Tokyo (JP)

(73) Assignee: Advantest Corporation (JP)

( * ) Notice: Subject to any disclaimer, the term of this patent is extended or adjusted under 35 U.S.C. 154(b) by 73 days.

(21) Appl. No.: 12/135,202

(22) Filed: Jun. 8, 2008

(65) Prior Publication Data

US 2009/0302908 A1 Dec. 10, 2009

(51) Int. Cl.
*H03L 7/085* (2006.01)
*H03L 7/093* (2006.01)
*H03L 7/18* (2006.01)

(52) U.S. Cl. ............................. 331/16; 331/17; 331/25

(58) Field of Classification Search .................. 331/1 A, 331/16–18, 25
See application file for complete search history.

(56) References Cited

U.S. PATENT DOCUMENTS

| | | | | |
|---|---|---|---|---|
| 3,810,046 A | * | 5/1974 | Lance | 332/128 |
| 3,898,580 A | * | 8/1975 | Millsap | 331/15 |
| 4,479,091 A | * | 10/1984 | Yoshisato | 329/326 |
| 4,816,770 A | * | 3/1989 | Naumann | 329/318 |
| 4,987,387 A | * | 1/1991 | Kennedy et al. | 331/1 A |
| 5,339,050 A | * | 8/1994 | Llewellyn | 331/16 |
| 5,389,899 A | * | 2/1995 | Yahagi et al. | 331/10 |
| 5,404,250 A | * | 4/1995 | Hase et al. | 360/51 |
| 5,420,545 A | * | 5/1995 | Davis et al. | 331/17 |
| 5,675,292 A | * | 10/1997 | McCune, Jr. | 331/17 |
| 5,687,201 A | * | 11/1997 | McClellan et al. | 375/374 |
| 5,748,046 A | * | 5/1998 | Badger | 331/17 |
| 6,549,599 B2 | * | 4/2003 | Momtaz | 375/376 |
| 6,664,826 B1 | * | 12/2003 | Creed et al. | 327/147 |
| 6,834,183 B2 | * | 12/2004 | Black et al. | 455/182.1 |
| 2004/0109521 A1 | * | 6/2004 | Jeong et al. | 375/376 |

FOREIGN PATENT DOCUMENTS

| | | |
|---|---|---|
| JP | 2001-016102 | 1/2001 |
| JP | 2004-274673 | 9/2004 |
| JP | 2005-252930 | 9/2005 |
| JP | 2006-080909 | 3/2006 |

* cited by examiner

*Primary Examiner*—David Mis
(74) *Attorney, Agent, or Firm*—Chen Yoshimura LLP

(57) ABSTRACT

There is provided an oscillator including: a reference signal generator that generates a reference signal having a reference frequency; a phase comparator that outputs a voltage in accordance with a phase difference between the reference signal and a feedback signal; a loop filter that receives a voltage output from the phase comparator, and gain-adjusts a voltage output from the phase comparator by means of an external control signal; a voltage controlled oscillator that oscillates an output signal at a frequency in accordance with an adjusted signal having been gain-adjusted by the loop filter; and a frequency divider that feeds back a frequency-divided signal resulting from frequency-dividing the output signal, to the phase comparator as the feedback signal.

10 Claims, 9 Drawing Sheets

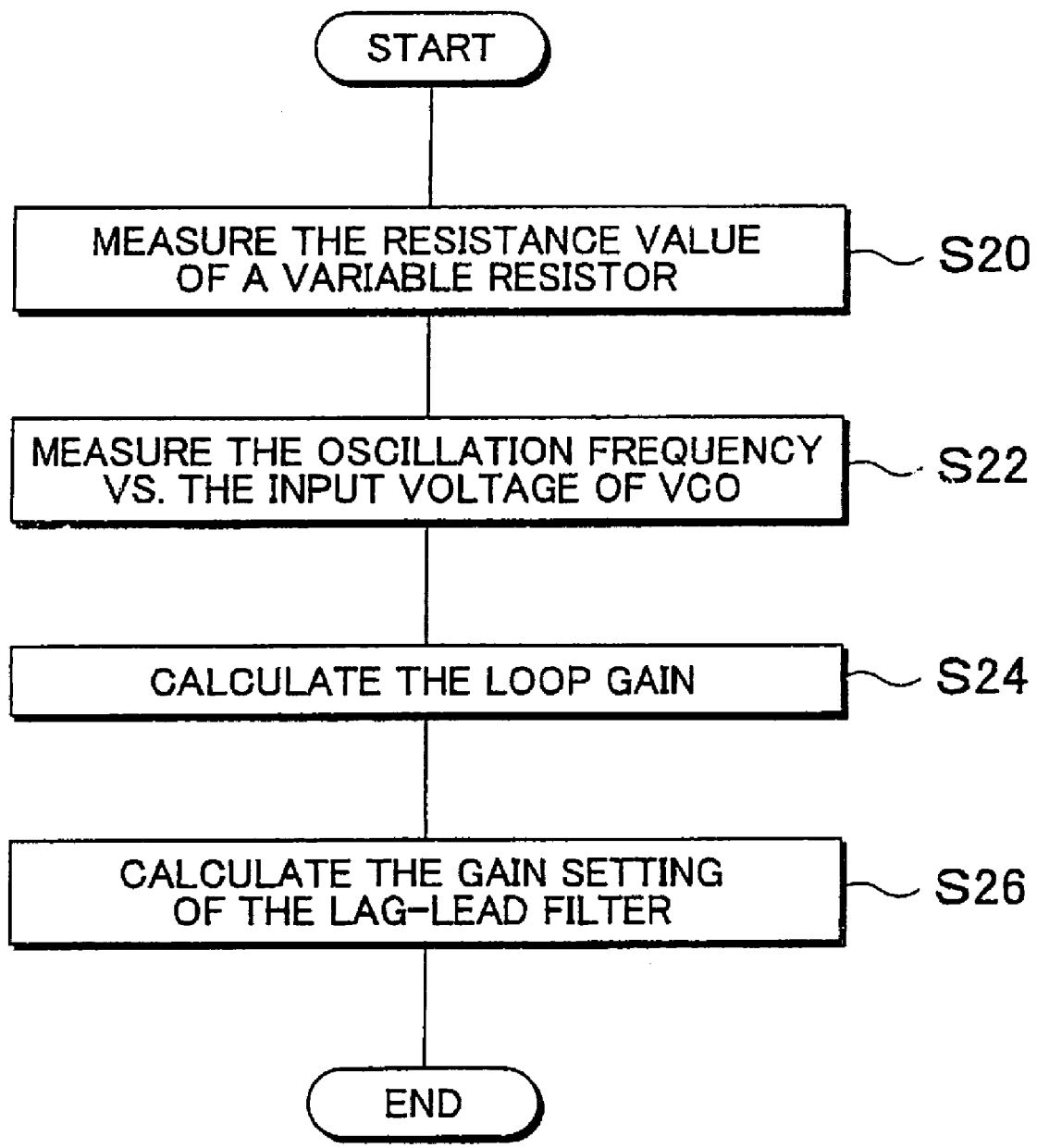
F I G . 2

| SET FREQUENCY | DIVISION RATIO N | SENSITIVITY Kv |
|---|---|---|
| 10 | N0 | Kv0 |
| 11 | N2 | Kv1 |
| 12 | N3 | Kv2 |
| . | . | . |
| . | . | . |
| In | Nn | Kvn |

FIG. 5

| SET FREQUENCY | DIVISION RATIO N | EXTERNAL CONTROL SIGNAL SET VALUE | |
| --- | --- | --- | --- |
| | | WHEN FREQUENCY CHARACTERISTIC IS IMPORTANT | WHEN SPEED IS IMPORTANT |
| 10 | N0 | Data f0 | Data S0 |
| 11 | N2 | Data f1 | Data S1 |
| 12 | N3 | Data f2 | Data S2 |
| . | . | . | . |
| . | . | . | . |
| In | Nn | Data fn | Data Sn |

FIG. 6

OSCILLATOR AND A TUNING METHOD OF A LOOP BANDWIDTH OF A PHASE-LOCKED-LOOP

BACKGROUND

1. Technical Field

The present invention relates to an oscillator and a loop bandwidth tuning method of a phase lock loop. In particular, the present invention relates to an oscillator including a voltage controlled oscillator, the sensitivity of which changes depending on a frequency of a signal to be processed, and to a loop bandwidth tuning method of a phase lock loop having such a voltage controlled oscillator.

2. Related Art

A conventionally known phase lock loop (PLL) synchronizes a phase difference between an output signal of a voltage controlled oscillator (VCO), the frequency of which changes according to the voltage and a reference signal having a reference frequency input to the VCO, by sending feedback to the VCO. The PLL can generate a frequency-multiplied signal of the input signal, by using a frequency-divided signal of the output signal of the VCO, as a feedback signal to the VCO.

When the sensitivity of the VCO depends on frequencies, the change in oscillation frequency of the PLL will change the loop bandwidth, to change the phase noise characteristic, the spurious characteristic, and the output frequency switch time. For maintaining the loop bandwidth to be constant, the PLL is occasionally provided with a gain switcher of a loop filter. Japanese Patent Application Publication No. 2001-16102 discloses a PLL circuit having a gain switcher composed of a voltage dividing circuit and a plurality of switch elements, to switch the loop gain by switching the circuitry configuration of the voltage dividing circuit by means of the switch elements, where the voltage dividing circuit is composed of a resistance and a capacitor element.

However, the PLL circuit of Japanese Patent Application Publication No. 2001-16102 is only able to switch the loop gain discretely, and cannot optimize the gain in accordance with the oscillation frequency. If the PLL circuit is provided with a multitude of voltage dividing circuits for optimizing the gain in accordance with the oscillation frequency, the circuitry dimension becomes large. When the sensitivity of the VCO is unknown, the gain value of the voltage dividing circuit cannot be reasonably determined. Note that related arts also include Japanese Patent Application Publication No. 2006-80909, Japanese Patent Application Publication No. 2005-252930, and Japanese Patent Application Publication No. 2004-274673, in addition to Japanese Patent Application Publication No. 2001-16102 mentioned above.

SUMMARY

Therefore, it is an object of an aspect of the innovations herein to provide an oscillator and a loop bandwidth tuning method of a phase lock loop, which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary oscillator includes: a reference signal generator that generates a reference signal having a reference frequency; a phase comparator that outputs a voltage in accordance with a phase difference between the reference signal and a feedback signal; a loop filter that receives a voltage output from the phase comparator, and gain-adjusts a voltage output from the phase comparator by means of an external control signal; a voltage controlled oscillator that oscillates an output signal at a frequency in accordance with an adjusted signal having been gain-adjusted by the loop filter; and a frequency divider that feeds back a frequency-divided signal resulting from frequency-dividing the output signal, to the phase comparator as the feedback signal.

It is also possible to arrange so that the oscillator further includes a controller that outputs the external control signal to control the loop filter according to a sensitivity of the voltage controlled oscillator or a division ratio of the frequency divider by means of the external control signal, where the controller controls a gain of the loop filter so that a total gain of the oscillator becomes a target value.

It is also possible to arrange so that the loop filter includes an integrator that removes an alternative current component by integrating a voltage output from the phase comparator, and a lag-lead filter, the lag-lead filter includes a series resistor inserted to a signal line and a series circuit having a shunt resistor and a capacitor provided between the signal line and a ground, the shunt resistor includes a variable resistor, the resistance value of which is controlled by the external control signal, and the controller controls the resistance value of the variable resistor and controls the loop gain according to the sensitivity of the voltage controlled oscillator or the division ratio of the frequency divider by means of the external control signal. Moreover, in the stated oscillator, the controller may generate the external control signal based on a correspondence relation between the external control signal and a frequency set to the output signal according to the division ratio of the frequency divider.

It is also possible to arrange so that the oscillator further includes: a gain characteristic obtaining section that obtains a gain characteristic of the lag-lead filter with respect to the external control signal; a sensitivity characteristic obtaining section that obtains a sensitivity characteristic of the voltage controlled oscillator with respect to an input voltage to the voltage controlled oscillator; a loop gain calculator that calculates the loop gain for each set frequency based on a sensitivity characteristic of the voltage controlled oscillator obtained by the sensitivity characteristic obtaining section; a lag-lead filter gain calculator that calculates a target gain of the lag-lead filter for each set frequency such that a total gain for each set frequency becomes a target value, based on the loop gain for each set frequency; and a correspondence relation determining section that determines a correspondence relation between the set frequency and the external control signal.

It is also possible to arrange so that the correspondence relation determining section determines the correspondence relation between the set frequency and the external control signal by calculating the external control signal such that the lag-lead filter gain of the lag-lead filter becomes the target gain for each set frequency based on the gain characteristic of the lag-lead filter obtained by the gain characteristic obtaining section and the target gain for each set frequency calculated by the lag-lead filter gain calculator.

It is also possible to arrange so that the gain characteristic obtaining section obtains the gain characteristic of the lag-lead filter with respect to the external control signal by measuring the resistance value of the shunt resistor with respect to the external control signal, and the sensitivity characteristic obtaining section obtains the sensitivity characteristic of the voltage controlled oscillator with respect to the input voltage of the voltage controlled oscillator by measuring an oscillation frequency with respect to the input voltage of the voltage controlled oscillator. In the stated oscillator, the correspondence relation determining section may determine the correspondence relation during operation of the oscillator.

It is also possible to arrange so that the loop filter includes a charge pump that adjusts an output current by means of the external control signal. In the stated oscillators, the loop filter may include a step amplifier. It is also possible to arrange so that the reference signal generator, the phase comparator, the loop filter, the voltage controlled oscillator, and the frequency divider are formed above a single semiconductor substrate.

According to the second aspect related to the innovations herein, one exemplary loop bandwidth tuning method for a phase lock loop includes: generating a reference signal having a reference frequency; outputting a voltage in accordance with a phase difference between the reference signal and a feedback signal; gain-adjusting a voltage according to the phase difference, by means of an external control signal; oscillating an output signal at a frequency in accordance with an adjusted signal having been gain-adjusted in the gain-adjusting; and feeding back a frequency-divided signal resulting from frequency-dividing the output signal, as the feedback signal.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 2 shows an exemplary processing procedure of a correspondence relation determining section 198.

FIG. 5 schematically shows a correspondence relation among the frequency set to the voltage controlled oscillator 126, the division ratio of the frequency divider 128, and the sensitivity of the voltage controlled oscillator 126.

FIG. 6 schematically shows a correspondence relation among the frequency set to the voltage controlled oscillator 126, the division ratio of the frequency divider 128, and the value set to the external control signal 14.

DESCRIPTION OF EXEMPLARY EMBODIMENTS

Figure 1:
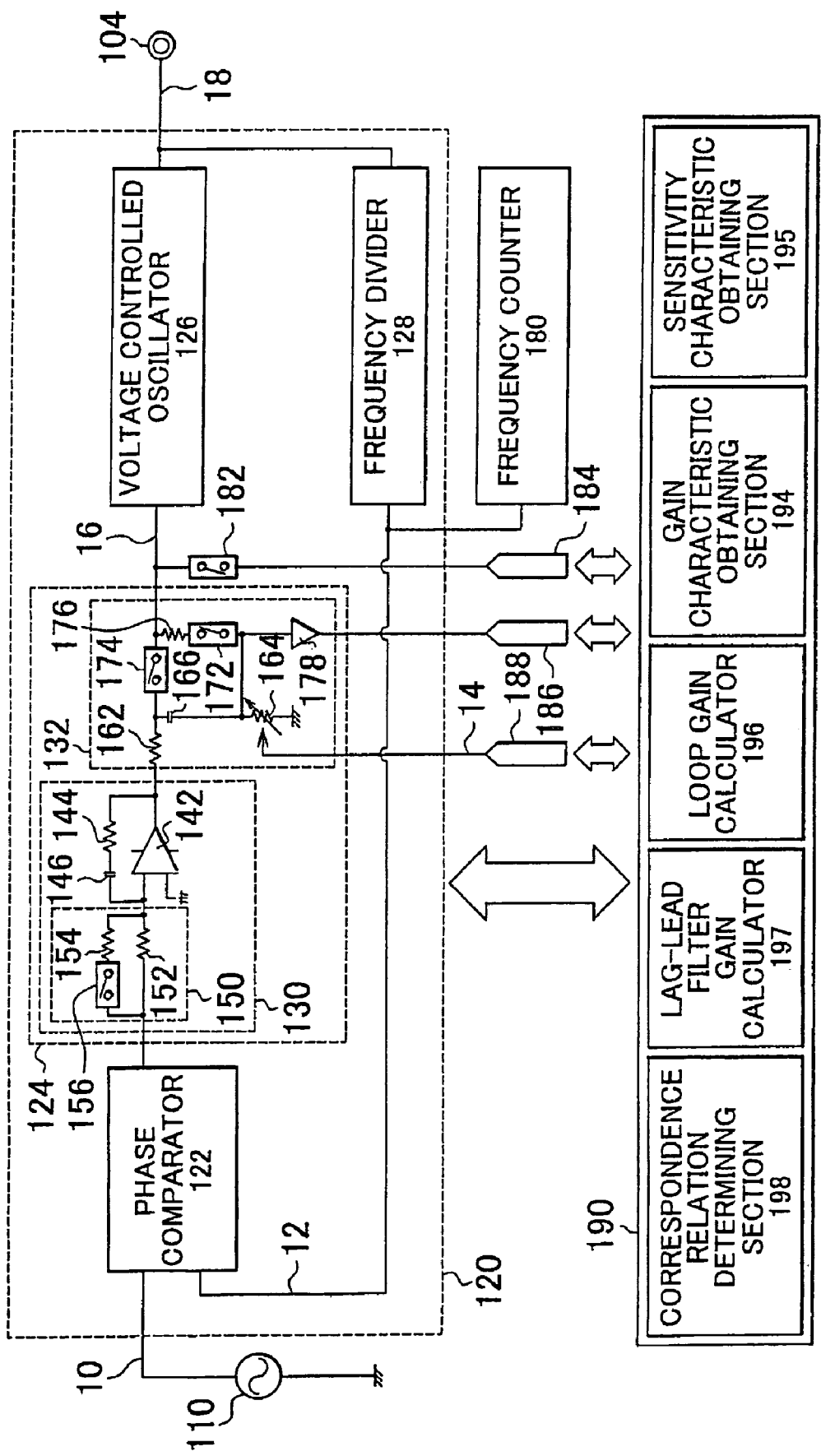
FIG. 1 schematically shows an exemplary configuration of an oscillator 100.

Some aspects of the invention will now be described based on the embodiments, which do not intend to limit the scope of the present invention, but exemplify the invention. All of the features and the combinations thereof described in the embodiment are not necessarily essential to the invention. The same or similar elements may occasionally be provided with the same reference numeral, to omit the related description thereof.

FIG. 1 schematically shows an exemplary configuration of an oscillator 100. The oscillator 100 oscillates a stable high frequency signal. The oscillator 100 includes an output terminal 104, a reference signal generator 110, and a phase lock loop 120. The output terminal 104 is provided at the output side of the phase lock loop 120, and outputs an output signal 18 oscillated by the phase lock loop 120 to outside. The reference signal generator 110 generates a reference signal 10 having a reference frequency. An example of the reference signal generator 110 is a crystal oscillator. According to this, the stability of the reference signal 10 improves. In addition, the reference signal generator 110 and the phase lock loop 120 may be formed above a single semiconductor chip or a single semiconductor substrate.

The phase lock loop 120 outputs an output signal 18 upon receiving a reference signal 10 from the reference signal generator 110. The phase lock loop 120 synchronizes the reference frequency of the reference signal 10 to the frequency of the output signal 18. The phase lock loop 120 also multiplies the frequency of the output signal 18 up to an integer number of times of the reference frequency. The phase lock loop 120 includes a phase comparator 122, a loop filter 124, a voltage controlled oscillator 126, and a frequency divider 128. The phase comparator 122, the loop filter 124, the voltage controlled oscillator 126, and the frequency divider 128 may be provided above a single semiconductor substrate.

The phase comparator 122 outputs a voltage in accordance with the phase difference between the reference signal 10 and a feedback signal 12. The phase comparator 122 may receive the reference signal 10 output from the reference signal generator 110, and the feedback signal 12 output from the frequency divider 128. The voltage controlled oscillator 126 oscillates the output signal 18 at a frequency in accordance with the adjusted signal 16 having been gain-adjusted by the loop filter 124. The voltage controlled oscillator 126 may receive the adjusted signal 16 output from the loop filter 124. The frequency divider 128 feeds back a frequency-divided signal resulting from frequency-dividing the output signal 18, to the phase comparator 122 as a feedback signal 12. An example of the frequency divider 128 is a counter. The frequency divider 128 may receive part of the output signal 18 output from the voltage controlled oscillator 126.

The loop filter 124 determines a loop time constant of the phase lock loop 120. Specifically, the phase filter 124 receives a voltage output from the phase comparator 122, and adjusts the gain of the received voltage by means of the external control signal 14. The loop gain of the loop filter 124 may be controlled by the external control signal 14 according to the sensitivity of the voltage controlled oscillator 126 or the division ratio of the frequency divider 128. The loop filter 124 may adjust the gain of the voltage output from the phase comparator 122, so that the total gain of the oscillator 100 may become the target value. The loop filter 124 may include a step amplifier 130 and a lag-lead filter 132.

The step amplifier 130 has an integrating function of removing the alternate current component by integrating the voltage output from the phase comparator 122. The step amplifier 130 has an amplifying function of amplifying the voltage output from the phase comparator 122 by a predetermined gain. The step amplifier 130 may receive a voltage output from the phase comparator 122. The step amplifier 130 may include an operation amplifier 142, a resistor 144, a capacitor 146, and a gain switcher 150. The gain switcher 150 may include a resistor 152, a resistor 154, and a switch 156. The gain switcher 150 changes the gain of the step amplifier 130 by switching between ON and OFF of the switch 156.

Accordingly, the gain variable width of the loop filter 124 can be changed. For example, suppose a case where the loop filter 124 has a lag-lead filter 132 having a gain, the variable width of which is between −G dB and 0 dB, and a gain switcher 150 capable of switching the gain value between G dB and 0 dB by switching ON and OFF of the switch 156. When the switch 156 is OFF, the loop gain variable width of the loop filter 124 will be between −G dB and 0 dB, while when the switch 156 is ON, the loop gain variable width of the loop filter 124 will be between 0 dB and G dB. In this way, the step amplifier 130 is able to expand the gain variable width of the loop filter 124. The gain switcher 150 has two resistors in the present embodiment. However, the gain switcher 150 may include three or more resistors, or may have a variable resistor to continuously change the gain.

The lag-lead filter 132 determines the gain variable width of the loop filter 124. The lag-lead filter 132 may receive a voltage from which the alternate current component is removed by the step amplifier 130. The lag-lead filter 132 may include a series resistor 162 inserted to a signal line, and a series circuit having a shunt resistor and a capacitor 166 provided between the signal line and the ground. The shunt resistor may include a variable resistor 164, the resistance value of which is controlled by the external control signal 14.

Accordingly, the loop filter 124 can adjust the gain of the voltage output from the phase comparator 122 by means of the external control signal 14. The loop filter 124 is able to continuously change the loop gain while restraining the increase in the circuitry dimension. The loop filter 124 is able to optimize the gain in accordance with the oscillation frequency, by continuously changing the loop gain.

The lag-lead filter 132 may include a switch 172, a switch 174, a resistor 176, and a buffer 178. The switch 172 and the resistor 176 may be connected serially, the capacitor 166 and the switch 174 may be connected serially, and the switch 172 and the resistor 176 may be connected in parallel with the capacitor 166 and the switch 174. The buffer 178 may be provided between the variable resistor 164 and the capacitor 166. Accordingly, the gain characteristic of the lag-lead filter 132 with respect to the external control signal 14 can be obtained. Note that the configuration of obtaining the gain characteristic of the lag-lead filter 132 is not limited to as described above.

The oscillator 100 may include a frequency counter 180, a switch 182, and a digital-to-analogue (DA) converter 184. The oscillator 100 may include an analogue-to-digital (AD) converter 186 and a DA converter 188. The frequency counter 180 is provided between the frequency divider 128 and the phase comparator 122 to measure the frequency of the feedback signal 12. The DA converter 184 is coupled between the loop filter 124 and the voltage controlled oscillator 126 via the switch 182.

Accordingly, it becomes possible to obtain the sensitivity characteristic of the voltage controlled oscillator 126 with respect to the input voltage to the voltage controlled oscillator 126. The configuration of obtaining the sensitivity characteristic of the voltage controlled oscillator 126 is not limited to as described above. The AD converter 186 is coupled to the buffer 178, and converts the voltage applied to the variable resistor 164 into a digital signal. The DA converter 188 is coupled to the variable resistor 164, and converts the external control signal 14 for controlling the variable resistor 164, into an analogue signal.

The oscillator 100 may include an controller 190 for controlling the oscillator 100. The controller 190 may output an external control signal 14 to control the loop filter 124 by means of the external control signal 14. The gain of the loop filter 124 may be controlled so that the total gain of the oscillator 100 becomes the target value. The controller 190 may control the resistance value of the variable resistor 164 by means of the external control signal 14 to control the gain of the loop filter 124 in accordance with the sensitivity of the voltage controlled oscillator 126 or the division ratio of the frequency divider 128. The controller 190 may generate the external control signal 14 based on the correspondence relation between the external control signal 14 and the frequency set to the output signal 18 according to the division ratio of the frequency divider 128. Note that the controller 190 is provided inside the oscillator 100 in the present embodiment. However, the controller 190 may be provided outside the oscillator 100.

The oscillator 100 may include a gain characteristic obtaining section 194, a sensitivity characteristic obtaining section 195, a loop gain calculator 196, a lag-lead filter gain calculator 197, and a correspondence relation determining section 198. The gain characteristic obtaining section 194, the sensitivity characteristic obtaining section 195, the loop gain calculator 196, the lag-lead filter gain calculator 197, and the correspondence relation determining section 198 may be provided in the controller 190. Note that these functions are not strictly distinguishable from each other. For example, the correspondence relation determining section 198 may have functions of the loop gain calculator 196 and the lag-lead filter gain calculator 197, or the sensitivity characteristic obtaining section 195 may have a function of the loop gain calculator 196.

The gain characteristic obtaining section 194 obtains the gain characteristic of the lag-lead filter 132 with respect to the external control signal 14. The gain characteristic obtaining section 194 may obtain the gain characteristic of the lag-lead filter 132 with respect to the external control signal 14, by measuring the resistance value of the shunt resistor with respect to the external control signal 14. The sensitivity characteristic obtaining section 195 obtains the sensitivity characteristic of the voltage controlled oscillator 126 with respect to the input voltage to the voltage controlled oscillator 126. The sensitivity characteristic obtaining section 195 may obtain the sensitivity characteristic of the voltage controlled oscillator 126 with respect to the adjusted signal 16, by measuring the oscillation frequency with respect to the input voltage of the voltage controlled oscillator 126.

The loop gain calculator 196 calculates the loop gain for each set frequency, based on the sensitivity characteristic of the voltage controlled oscillator 126 obtained by the sensitivity characteristic obtaining section 195. The lag-lead filter gain calculator 197 calculates the target gain of the lag-lead filter 132 for each set frequency, such that the total gain for each set frequency becomes the target value, based on the loop gain for each set frequency.

The correspondence relation determining section 198 determines the correspondence relation between the set frequency and the external control signal 14. The correspondence relation determining section 198 may determine the correspondence relation between the set frequency and the external control signal, by calculating the external control signal 14 for each set frequency such that the lag-lead filter gain of the lag-lead filter becomes the target gain for the corresponding set frequency, based on the gain characteristic of the lag-lead filter 132 obtained by the gain characteristic obtaining section 194 and the target gain of the lag-lead filter 132 for each set frequency calculated by the lag-lead filter gain calculator 197. Accordingly, the gain value of the loop filter 124 can be reasonably determined.

The correspondence relation determining section 198 may determine the correspondence relation between the set frequency and the external control signal, during operation of the oscillator 100. The correspondence relation determining section 198 may determine the correspondence relation prior to the operation start of the oscillator 100. The correspondence relation determining section 198 may determine the correspondence relation when the phase noise characteristic, the spurious characteristic, and the output frequency switch time or the like of the oscillator 100 have deteriorated.

FIG. 2 shows an exemplary procedure of determining the correspondence relation between the set frequency of the output signal 18 and the external control signal 14, performed by the correspondence relation determining section 198. The oscillator 100 can control the total gain at high speed, as a result of the controller 190 determining the value of the external control signal 14 based on the correspondence relation.

In S20, the oscillator 100 measures the resistance value of the variable resistor 164 with respect to the external control signal 14. Accordingly, the gain characteristic obtaining section 194 can obtain the gain characteristic of the lag-lead filter 132 with respect to the external control signal 14 input to the variable resistor 164 via the DA converter 188. The resistance value of the variable resistor 164 can be measured according to the following procedure, for example.

That is, the switch 172 and the switch 182 are set ON, and the switch 174 is set OFF. The DA converter 184 is fixed to a predetermined value. While sweeping the voltage of the DA converter 188, the voltage applied to the variable resistor 164 is measured at the AD converter 186. The resistance value of the variable resistor 164 with respect to the external control signal 14 is calculated based on the measured voltage using the relation regarding the division ratio between the resistor 176 and the variable resistor 164.

By calculating the input output transfer constant of the lag-lead filter 132 including the series resistor 162, the variable resistor 164, and the capacitor 166, i.e. gain $G_{Lag}$ of the lag-lead filter 132, with respect to each set value of the external control signal 14 by using the resistance value of the variable resistor 164, the relation between each value set to the external control signal 14 and the gain $G_{Lag}$ of the lag-lead filter 132 is obtained. The gain characteristic obtaining section 194 may memorize the gain $G_{Lag}$ of the lag-lead filter 132 with respect to each value set to the external control signal 14, in a table format.

In S22, the oscillator 100 measures the oscillation frequency of the voltage controlled oscillator 126 with respect to the input voltage of the voltage controlled oscillator 126. Accordingly, the sensitivity characteristic obtaining section 195 is able to obtain the sensitivity characteristic of the voltage controlled oscillator 126 with respect to the adjusted signal 16. The oscillation frequency of the above-described voltage controlled oscillator 126 can be measured according to the following procedure, for example. That is, the switch 172 and the switch 174 are set OFF, and the switch 182 is set ON. While sweeping the voltage of the DA converter 184, the output frequency of the frequency divider 128 is measured at the frequency counter 180.

The oscillation frequency is differentiated by the input voltage, based on the measurement result of the oscillation frequency of the voltage controlled oscillator 126 with respect to the input voltage of the voltage controlled oscillator 126, to obtain the sensitivity Kv of the voltage controlled oscillator 126. The sensitivity characteristic obtaining section 195 may memorize the sensitivity Kv with respect to the input voltage of the voltage controlled oscillator 126, in a table format.

In S24, the loop gain calculator 196 calculates the loop gain $G_{Loop}$ for each frequency set to the output signal 18, based on the sensitivity characteristic of the voltage controlled oscillator 126 obtained by the sensitivity characteristic obtaining section 195. The loop gain $G_{Loop}$ can be calculated by Equation 1 using the sensitivity Kv Hz/V of the voltage controlled oscillator 126 and the division ratio N of the frequency divider 128.

$$G_{Loop}=Kv/N \qquad \text{Equation 1}$$

Here, when the frequency set to the output signal 18 is given, the sensitivity Kv of the voltage controlled oscillator 126 will be obtained based on the measurement result regarding the oscillation frequency with respect to the input voltage of the voltage controlled oscillator 126 as well as the calculation result of the sensitivity with respect to the input voltage of the voltage controlled oscillator 126 obtained in S22. In addition, the division ratio N is obtained by dividing the set frequency by the reference frequency of the reference signal 10.

In S26, the lag-lead filter gain calculator 197 calculates the gain $G_{Lag}$ of the lag-lead filter 132 for each set frequency, based on the loop gain $G_{Loop}$ for each set frequency. The lag-lead filter gain calculator 197 calculates the gain $G_{Lag}$ of the lag-lead filter 132 such that the total gain $G_{row1}$ of each set frequency becomes the target value. The gain $G_{Lag}$ of the lag-lead filter 132 can be calculated according to the following procedure for example. That is, the gain $G_{Lag}$ of the lag-lead filter 132 can be calculated by Equation 2 using the total gain $G_{Total}$ of the phase lock loop 120, the sensitivity Kv of the voltage controlled oscillator 126, and the division ratio N of the frequency divider 128.

$$G_{Lag}=G_{Total}/(Kv/N) \qquad \text{Equation 2}$$

Here, when the target value $G_{Total\text{-}Target}$ of the total gain is given for each set frequency, the target gain $G_{Lag\text{-}Target}$ of the lag-lead filter 132 such that the total gain $G_{Total}$ for each set frequency becomes $G_{Total\text{-}Target}$ is obtained by substituting the target value $G_{Total\text{-}Target}$ to $G_{Total}$ in Equation 2. The correspondence relation determining section 198 determines the value set to the external control signal 14 corresponding to the target gain $G_{Lag\text{-}Target}$ of the lag-lead filter 132, based on the relation between the gain $G_{Lag}$ of the lag-lead filter 132 and each value set to the external control signal 14 obtained in S20. The correspondence relation determining section 198 may memorize the correspondence relation between the frequency set to the output signal 18 and the external control signal 14, in a table format.

As described above, when the frequency set to the output signal 18 and the target value $G_{Total\text{-}Target}$ of the total gain for each set frequency are given, the correspondence relation between the frequency set to the output signal 18 and the external control signal 14 will be obtained. The above disclosure discloses a loop bandwidth tuning method for the phase lock loop 120, which includes: generating the reference signal 10 having a reference frequency; outputting a voltage in accordance with a phase difference between the reference signal 10 and the feedback signal 12; adjusting the gain of the voltage output from the phase comparator 122 by means of the external control signal 14 upon inputting of the voltage output from the phase comparator 122; oscillating the output signal 18 at a frequency in accordance with the adjusted signal 16 having been gain-adjusted; and feeding back the frequency-divided signal resulting from frequency-dividing the output signal 18, to the phase comparator 122 as a feedback signal 12.

Figure 3:
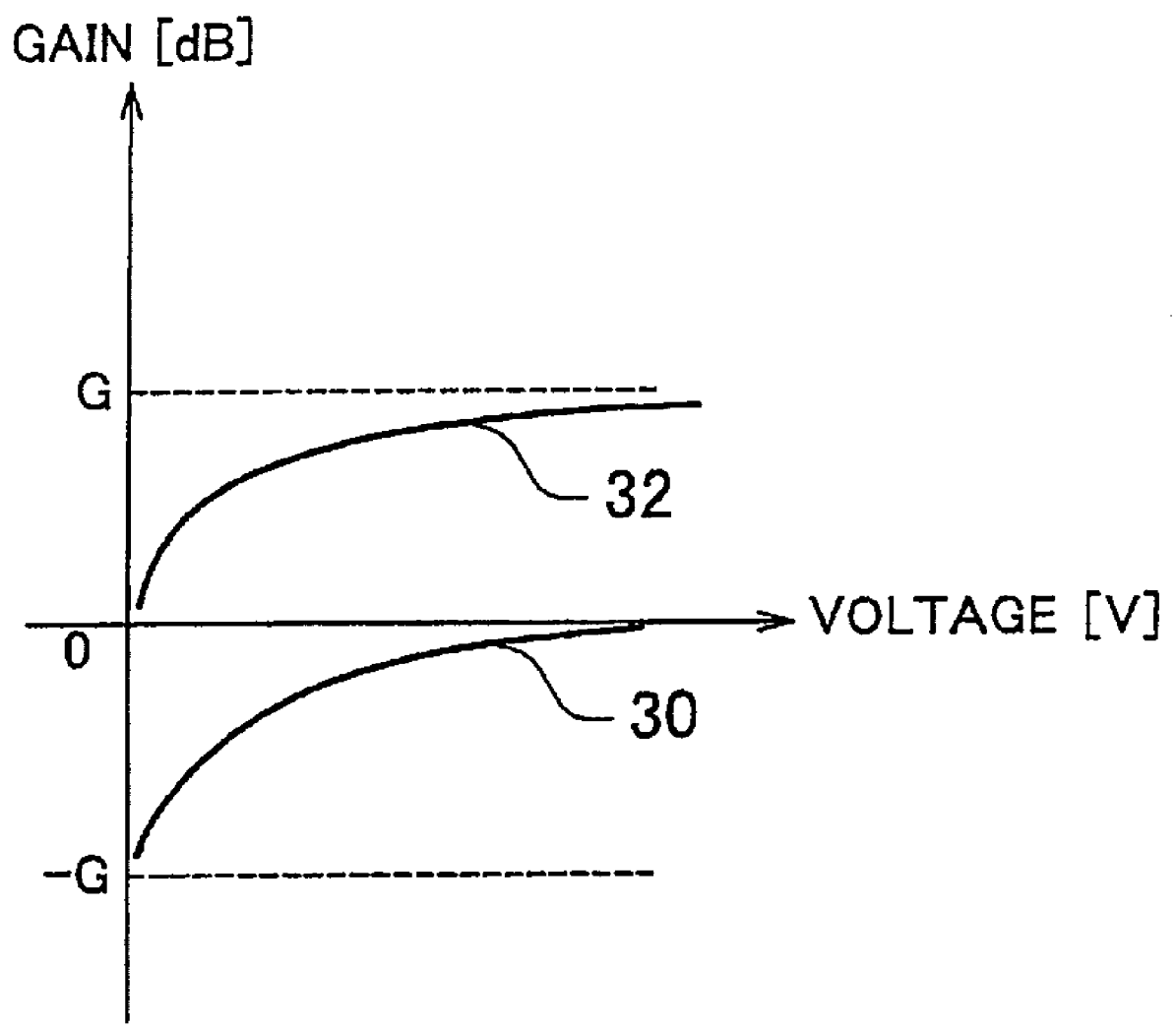
FIG. 3 schematically shows an exemplary gain characteristic of a lag-lead filter 132.

FIG. 3 schematically shows an exemplary gain characteristic of the lag-lead filter 132. In the drawing, the lateral axis represents a voltage of the DA converter 188 swept in S20, and the longitudinal axis represents the gain $G_{Lag}$ of the lag-lead filter 132 calculated using the resistance value of the variable resistor 164 obtained from the measured voltage. Here, the gain characteristic 30 results when the switch 156 of the gain switcher 150 is set OFF. The gain characteristic 32 results when the switch 156 of the gain switcher 150 is set ON. In this way, provision of the gain switcher 150 in the step amplifier 130 enables the gain variable width of the loop filter 124 to be changeable.

Figure 4:
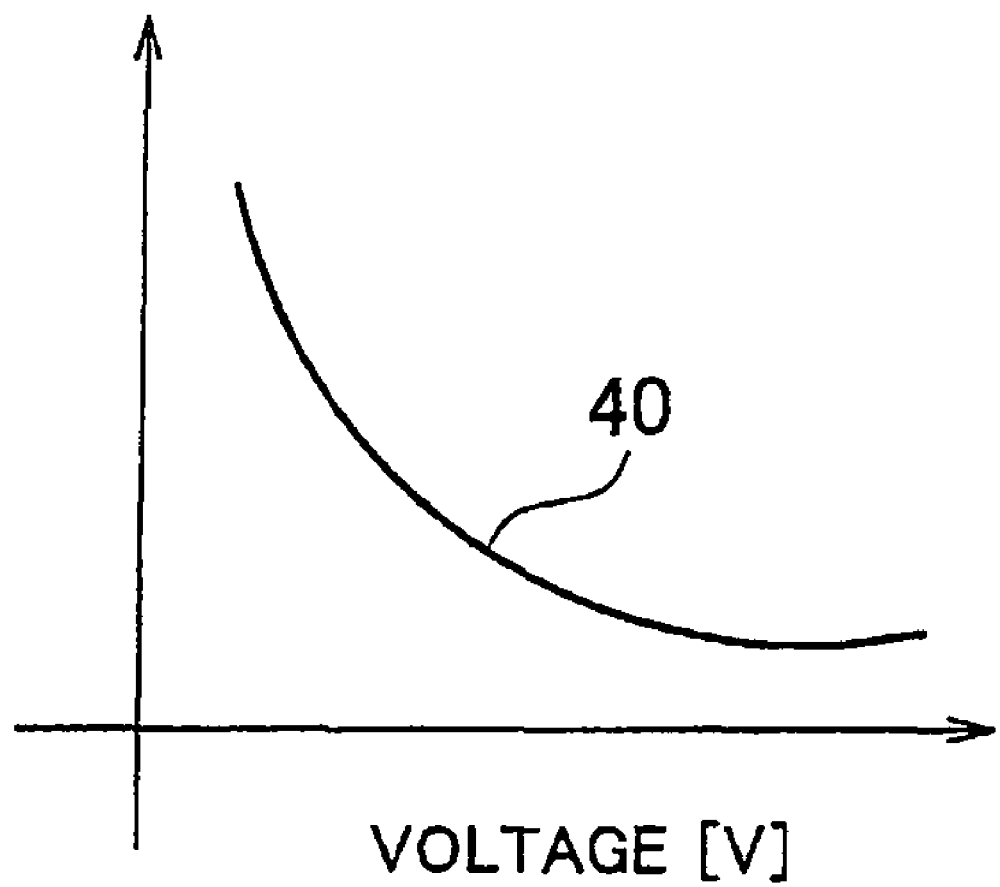
FIG. 4 schematically shows an exemplary sensitivity characteristic of the voltage controlled oscillator 126.

FIG. 4 schematically shows an exemplary sensitivity characteristic 40 of the voltage controlled oscillator 126. In the same drawing, the lateral axis represents a voltage of the DA converter 184 swept in S22, and the longitudinal axis represents the sensitivity Kv of the voltage controlled oscillator 126. As shown in the same drawing, the sensitivity Kv of the voltage controlled oscillator 126 depends on the input voltage of the voltage controlled oscillator 126.

FIG. 5 schematically shows an exemplary correspondence relation among the set frequency of the voltage controlled oscillator 126, the division ratio of the frequency divider 128, and the sensitivity of the voltage controlled oscillator 126. When the set frequency of the output signal 18 is given, the division ratio N is obtained. Therefore, the division ratio and the sensitivity with respect to the input voltage of the voltage controlled oscillator 126 corresponding to each set frequency can be shown in a table format.

FIG. 6 schematically shows an exemplary correspondence relation of the division ratio of the frequency divider 128 and the set value of the external control signal 14, with respect to the set frequency of the voltage controlled oscillator 126. As shown in the drawing, a plurality of values may be prepared for the set value of the external control signal 14 with respect to the set frequency of the voltage controlled oscillator 126 depending on purposes. For example, the external control signal 14 may have different set values between when the frequency characteristic is important, e.g. when pursuing improvement in phase noise characteristic, spurious characteristic, or the like, and when the speed is important, e.g. when pursuing shortening of an output frequency switch time. The oscillator 100 may also switch the set value of the external control signal 14 using an external input.

Figure 7:
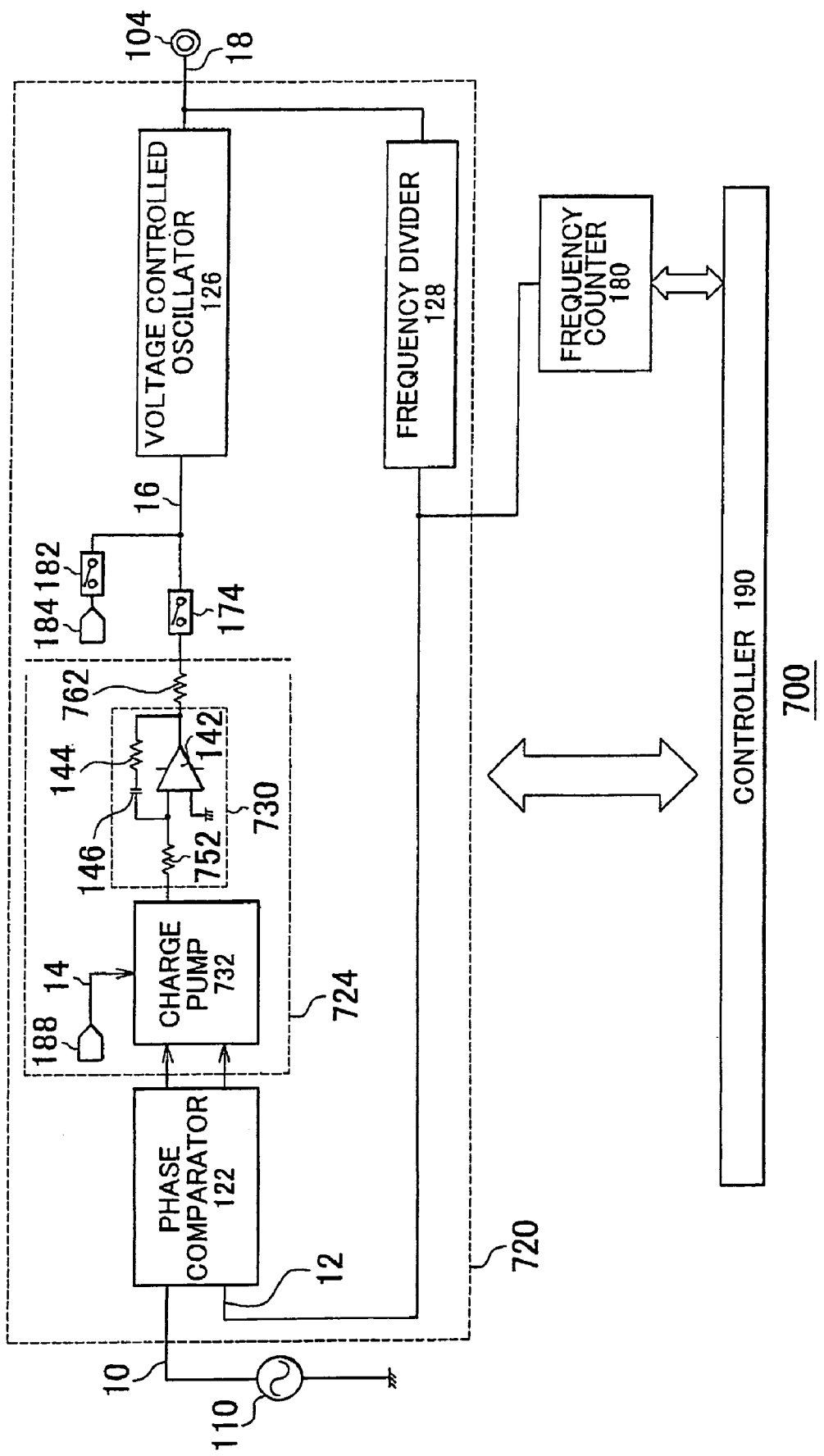
FIG. 7 schematically shows an exemplary configuration of an oscillator 700.

FIG. 7 schematically shows an exemplary configuration of an oscillator 700 according to another embodiment. The oscillator 700 includes an output terminal 104, a reference signal generator 110, a phase lock loop 720, and a controller 190. The phase lock loop 720 includes a phase comparator 122, a loop filter 724, a voltage controlled oscillator 126, and a frequency divider 128. The loop filter 724 includes an integrator 730, a charge pump 732, and an output resistor 762 of the integrator 730. The integrator 730 has the same configuration and function as those of the step amplifier 130, except for adoption of a resistor 752 instead of the gain switcher 150. Note that a step amplifier 130 may be used in place of the integrator 730 in the oscillator 700.

As shown in the drawing, the oscillator 700 is different from the oscillator 100, in that the charge pump 732 is provided instead of the lag-lead filter 132. The other function and configuration of the oscillator 700 may be the same as those of the oscillator 100, and the disclosure regarding the oscillator 100 can be applied to the oscillator 700.

The charge pump 732 adjusts the output current by means of the external control signal 14. The charge pump 732 increases the output current according to the set value of the external control signal 14, upon reception of an UP signal from the phase comparator 122 for example. On the other hand, when a DOWN signal is input from the phase comparator 122, the charge pump 732 decreases the output current according to the set value of the external control signal 14. According to the above-stated configuration, the gain of the loop filter 724 can be changed by controlling the set current of the charge pump 732 to be programmable using the DA converter 188.

The oscillator 700 may include a switch 174, a frequency counter 180, a switch 182, and a DA converter 184. The switch 174 may be provided between the loop filter 724 and the voltage controlled oscillator 126, and the DA converter 184 may be coupled between the switch 174 and the voltage controlled oscillator 126 via the switch 182.

Accordingly, the sensitivity characteristic of the voltage controlled oscillator 126 with respect to the input voltage to the voltage controlled oscillator 126 can be obtained. Note that the configuration of obtaining the sensitivity characteristic of the voltage controlled oscillator 126 is not limited to as described above. In addition, in the oscillator 700, the reference signal generator 110, the phase comparator 122, the loop filter 724, the voltage controlled oscillator 126, and the frequency divider 128 may be formed above a single semiconductor substrate.

Figure 8:
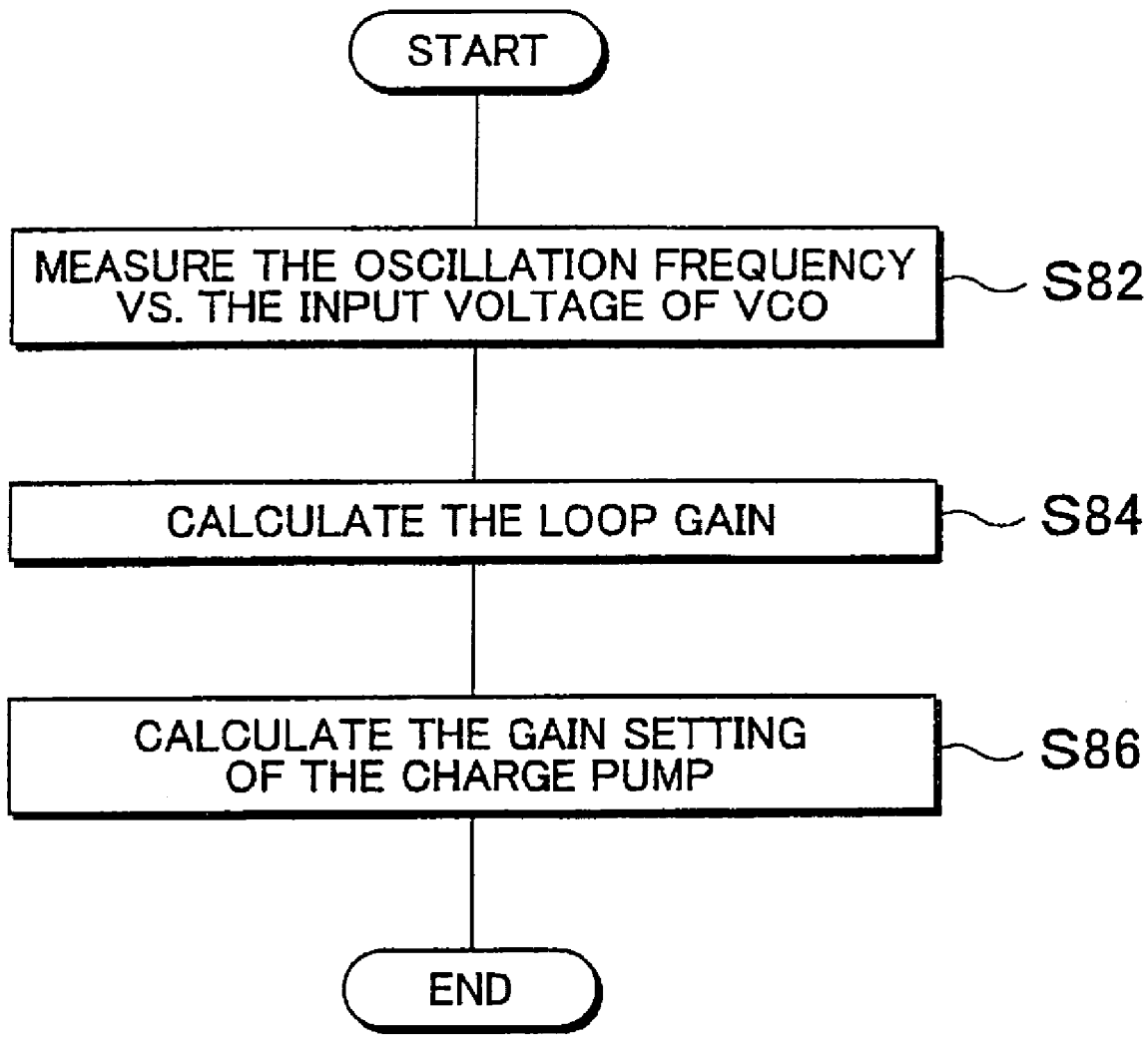
FIG. 8 shows an exemplary processing procedure of the oscillator 700.

FIG. 8 shows an exemplary procedure of determining the correspondence relation between the set frequency of the output signal 18 and the external control signal 14 in the oscillator 700. The oscillator 700 is able to control the total gain faster, by determining the value of the external control signal 14 based on this correspondence relation.

In S82, the oscillator 100 measures the oscillation frequency of the voltage controlled oscillator 126 with respect to the input voltage of the voltage controlled oscillator 126. Accordingly, the oscillator 700 can obtain the sensitivity characteristic of the voltage controlled oscillator 126 with respect to the adjusted signal 16. The oscillation frequency of the voltage controlled oscillator 126 can be measured according to the following procedure, for example.

That is, the switch 174 is set OFF, and the switch 182 is set ON. While sweeping the voltage of the DA converter 184, the output frequency of the frequency divider 128 is measured at the frequency counter 180. The sensitivity Kv of the voltage controlled oscillator 126 is calculated by differentiating the oscillation frequency by the input voltage based on the measurement result regarding the oscillation frequency of the voltage controlled oscillator 126 with respect to the input voltage of the voltage controlled oscillator 126.

In S84, the oscillator 700 calculates the loop gain $G_{Loop}$ for each frequency set to the output signal 18. The loop gain $G_{Loop}$ for each frequency set to the output signal 18 can be obtained according to the same procedure as S24.

In S86, the oscillator 700 calculates the gain $G_{Lag}$ of the charge pump 732 for each set frequency based on the loop gain $G_{Loop}$ for each set frequency. The gain $G_{Lag}$ of the charge pump 732 can be obtained according to the same procedure as S26. The relation between each set value of the external control signal 14 and the gain $G_{Lag}$ of the charge pump 732 is obtained according to the specification of the charge pump 732. Accordingly, it is possible to determine the set value of the external control signal 14 corresponding to the gain $G_{Lag}$ of the charge pump 732.

Figure 9:
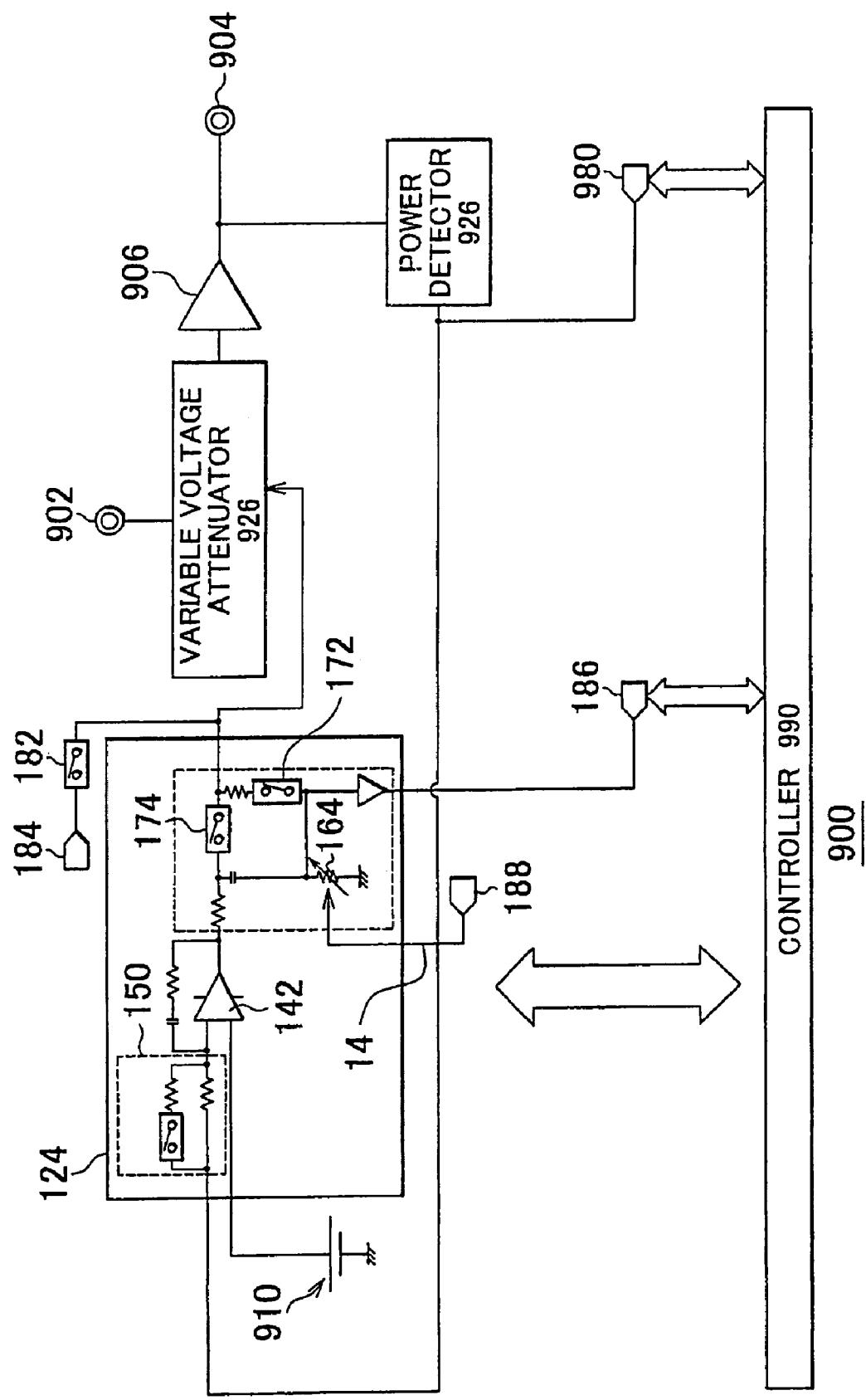
FIG. 9 schematically shows an exemplary configuration of an automatic level adjuster 900.

FIG. 9 schematically shows an exemplary configuration of the automatic level adjuster 900. The drawing shows an exemplary case where the loop filter 124 is applied to an ALC circuit. The automatic level adjuster 900 includes an input terminal 902, an output terminal 904, a buffer 906, and a variable voltage attenuator 926. The automatic level adjuster 900 may include a controller 990 for controlling the automatic level adjuster 900.

The automatic level adjuster 900 attenuates a signal input to the input terminal 902 to a suitable signal level using the variable voltage attenuator 926, and outputs the attenuated signal from the output terminal 904 via the buffer 906. The variable voltage attenuator 926 adjusts the attenuation amount of the input signal so that the power of the output signal output from the output terminal 904 becomes substantially constant, at a predetermined target value i.e. at a set power. The variable voltage attenuator 926 may control the attenuation amount of an input signal by the control voltage. The variable voltage attenuator 926 is able to change the attenuation amount of an input signal, by changing the internal resistance value, for example.

The automatic level adjuster 900 includes a reference voltage generator 910, a power detector 928, a loop filter 124, and a DA converter 188. The power detector 928 is coupled between the output terminal 904 and the buffer 906, and detects the attenuated signal attenuated by the variable voltage attenuator 926. The loop filter 124 receives the reference voltage generated by the reference voltage generator 910 and the output voltage of the output detector 928, and equalizes the output voltage of the power detector 928 to the reference voltage in response to the external control signal 14 input from the DA converter 188.

When the sensitivity of the variable voltage attenuator 926 is nonlinear, i.e. when the derivative characteristic of the attenuation amount with respect to the control voltage of the variable voltage attenuator 926 is nonlinear, the loop bandwidth, e.g. the total gain of the automatic level adjuster 900 will change depending on the value of the set power. When the loop bandwidth of the automatic level adjuster 900 changes, the transient response characteristic of the automatic level adjuster 900 also changes. According to the present embodiment, the controller 990 for example controls the gain of the loop filter 124 so that the total gain of the automatic level adjuster 900 becomes the target value. Accordingly, even when the variable voltage attenuator 926 changes nonlinearly in response to the control voltage, the nonlinearity of the variable voltage attenuator 926 can be compensated by means of the gain of the loop filter. As a result, it becomes easier to control the loop bandwidth of the automatic level adjuster 900 to be substantially constant at the set power.

Specifically, the output power of the power detector 928 is gain-adjusted at the loop filter 124 and is output from the loop filter 124 as an adjusted signal. The adjusted signal output from the loop filter 124 is input to the variable voltage attenuator 926 as a control voltage, and controls the attenuation amount of the input signal in the variable voltage attenuator 926. The controller 990 controls the gain of the loop filter 124 so that the total gain of the automatic level adjuster 900 becomes the target value, and so the loop filter 124 can optimize the loop gain according to the power of an input signal.

The automatic level adjuster 900 may include a switch 182, a DA converter 184, an AD converter 186, and an AD converter 980. The DA converter 184 may be provided between the loop filter 124 and the variable voltage attenuator 926 via the switch 182. The AD converter 980 may be provided between the power detector 928 and the loop filter 124.

Accordingly, the attenuation characteristic of the power detector 928 with respect to the adjusted signal of the loop filter 124 can be obtained. That is, while setting the switch 172 and the switch 174 to be OFF, and the switch 182 to be ON, a sine wave of a frequency "f" is input to the input terminal. The AD converter 980 measures the output voltage of the power detector 928. Accordingly, the attenuation characteristic of the power detector 928 for the frequency "f" is obtained. By differentiating the attenuation characteristic, the sensitivity of the variable voltage attenuator 926 is obtained. Using the above sensitivity, it is possible to determine a set value of the external control signal 14 that would yield an output signal having a substantially constant power at a set power, just as in the case of the oscillator 100. Accordingly, the gain value of the loop filter 124 can be reasonably determined.

The above disclosure discloses an automatic level adjustor 900 including: a reference voltage generator 910 that generates a reference voltage; a variable voltage attenuator 926 that attenuates an input signal; a power detector 928 that detects the signal attenuated by the variable voltage attenuator 926; and a loop filter 124 that receives the voltage output from the power detector 928, and adjusts the gain of the voltage output from the power detector 928 by means of an external control signal 14, where the input signal is attenuated according to the adjusted signal output form the loop filter 124. It is possible to arrange the variable voltage attenuator 926 to further include a controller 990 that outputs the external control signal 14 to control the loop filter 124 according to the sensitivity of the variable voltage attenuator 926 by means of the external control signal 14, where the controller 990 controls the gain of the loop filter 124 so that the total gain of an automatic level adjuster 900 becomes the target value.

The above disclosure explains a case where the loop bandwidth such as a total gain is maintained constant regardless of the frequency or the power of the output signal. However, the above-stated configuration is also applicable to a case where the loop bandwidth changes according to the frequency or the power. In addition, the above disclosure explains that the total gain is controlled by changing the gain of the loop filter 124 or the loop filter 724 to be programmable by means of the external control signal 14 input from the DA converter 188. However it is also possible to control the total gain by changing the output current from the phase comparator 122 to be programmable.

Although some aspects of the present invention have been described by way of exemplary embodiments, it should be understood that those skilled in the art might make many changes and substitutions without departing from the spirit and the scope of the present invention which is defined only by the appended claims.

As clear from the foregoing, an embodiment of the present invention realizes an oscillator oscillating a stable high frequency signal as well as a loop bandwidth tuning method of a phase lock loop.

What is claimed is:

1. An oscillator comprising:
    a reference signal generator that generates a reference signal having a reference frequency;
    a phase comparator that outputs a voltage in accordance with a phase difference between the reference signal and a feedback signal;
    a loop filter that receives the voltage output from the phase comparator, and gain-adjusts the voltage output from the phase comparator by means of an external control signal;
    a voltage controlled oscillator that oscillates an output signal at a frequency in accordance with an adjusted signal having been gain-adjusted by the loop filter;
    a frequency divider that feeds back a frequency-divided signal resulting from frequency-dividing the output signal, to the phase comparator as the feedback signal; and a controller that outputs the external control signal to control the loop filter according to a sensitivity of the voltage controlled oscillator or a division ratio of the frequency divider by means of the external control signal, wherein the controller controls a gain of the loop filter so that a total gain of the oscillator becomes a target value according to the frequency set to the output signal.

2. The oscillator according to claim 1, wherein the loop filter includes a charge pump that adjusts an output current by means of the external control signal.

3. The oscillator according to claim 1, wherein the loop filter includes a step amplifier.

4. The oscillator according to claim 1, wherein the reference signal generator, the phase comparator, the loop filter, the voltage controlled oscillator, and the frequency divider are formed above a single semiconductor substrate.

5. An oscillator comprising:

a reference signal generator that generates a reference signal having a reference frequency;

a phase comparator that outputs a voltage in accordance with a phase difference between the reference signal and a feedback signal;

a loop filter that receives the voltage output from the phase comparator, and gain-adjusts the voltage output from the phase comparator by means of an external control signal;

a voltage controlled oscillator that oscillates an output signal at a frequency in accordance with an adjusted signal having been gain-adjusted by the loop filter;

a frequency divider that feeds back a frequency-divided signal resulting from frequency-dividing the output signal, to the phase comparator as the feedback signal; and a controller that outputs the external control signal to control the loop filter according to a sensitivity of the voltage controlled oscillator or a division ratio of the frequency divider by means of the external control signal, wherein the controller controls a gain of the loop filter so that a total gain of the oscillator becomes a target value, the loop filter includes an integrator that removes an alternative current component by integrating the voltage output from the phase comparator, and a lag-lead filter, the lag-lead filter includes a series resistor inserted to a signal line and a series circuit having a shunt resistor and a capacitor provided between the signal line and a ground, the shunt resistor includes a variable resistor, the resistance value of which is controlled by the external control signal, and the controller controls the resistance value of the variable resistor and controls the loop gain according to the sensitivity of the voltage controlled oscillator or the division ratio of the frequency divider by means of the external control signal.

6. The oscillator according to claim 5, wherein the controller generates the external control signal based on a correspondence relation between the external control signal and the frequency set to the output signal according to the division ratio of the frequency divider.

7. The oscillator according to claim 6, further comprising:

a gain characteristic obtaining section that obtains a gain characteristic of the lag-lead filter with respect to the external control signal;

a sensitivity characteristic obtaining section that obtains a sensitivity characteristic of the voltage controlled oscillator with respect to an input voltage to the voltage controlled oscillator;

a loop gain calculator that calculates the loop gain for each set frequency based on a sensitivity characteristic of the voltage controlled oscillator obtained by the sensitivity characteristic obtaining section;

a lag-lead filter gain calculator that calculates a target gain of the lag-lead filter for each set frequency such that a total gain for each set frequency becomes a target value, based on the loop gain for each set frequency; and a correspondence relation determining section that determines a correspondence relation between the set frequency and the external control signal, wherein the correspondence relation determining section determines the correspondence relation between the set frequency and the external control signal by calculating the external control signal such that the lag-lead filter gain of the lag-lead filter becomes the target gain for each set frequency based on the gain characteristic of the lag-lead filter obtained by the gain characteristic obtaining section and the target gain for each set frequency calculated by the lag-lead filter gain calculator.

8. The oscillator according to claim 7, wherein the gain characteristic obtaining section obtains the gain characteristic of the lag-lead filter with respect to the external control signal by measuring the resistance value of the shunt resistor with respect to the external control signal, and the sensitivity characteristic obtaining section obtains the sensitivity characteristic of the voltage controlled oscillator with respect to the input voltage of the voltage controlled oscillator by measuring an oscillation frequency with respect to the input voltage of the voltage controlled oscillator.

9. The oscillator according to claim 8, wherein the correspondence relation determining section determines the correspondence relation during operation of the oscillator.

10. A loop bandwidth tuning method for a phase lock loop of an oscillator, the method comprising:

generating a reference signal having a reference frequency;

outputting a voltage in accordance with a phase difference between the reference signal and a feedback signal;

gain-adjusting, by a loop filter, the voltage according to the phase difference, by means of an external control signal;

oscillating, by a voltage controlled oscillator, an output signal at a frequency in accordance with an adjusted signal having been gain-adjusted in the gain-adjusting;

feeding back, by a frequency divider, a frequency-divided signal resulting from frequency-dividing the output signal, as the feedback signal; and outputting the external control signal to control the loop filter according to a sensitivity of the voltage controlled oscillator or a division ratio of the frequency divider by means of the external control signal, wherein a gain of the loop filter is controlled so that a total gain of the oscillator becomes a target value according to the frequency set to the output signal.

* * * * *